(12) United States Patent
Bauer et al.

(10) Patent No.: US 7,443,019 B2
(45) Date of Patent: Oct. 28, 2008

(54) SEMICONDUCTOR DEVICE WITH CONDUCTOR TRACKS BETWEEN SEMICONDUCTOR CHIP AND CIRCUIT CARRIER AND METHOD FOR PRODUCING THE SAME

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 11/498,253

(22) Filed: Aug. 3, 2006

(65) Prior Publication Data

US 2007/0034997 A1 Feb. 15, 2007

(30) Foreign Application Priority Data

Aug. 4, 2005 (DE) .................. 10 2005 037 321

(51) Int. Cl.
*H01L 21/56* (2006.01)
*H01L 21/58* (2006.01)

(52) U.S. Cl. ............ 257/692; 257/736; 257/750; 257/E23.018; 257/E23.013; 438/118; 438/611; 438/652; 438/669

(58) Field of Classification Search .......... 257/692, 257/736, 750, E23.013, E23.018; 438/118, 438/611, 652, 669

See application file for complete search history.

(56) References Cited

U.S. PATENT DOCUMENTS

| 4,811,081 A * | 3/1989 | Lyden ............ 257/668 |
| 5,045,436 A | 9/1991 | Tieke et al. |
| 2001/0007372 A1 * | 7/2001 | Akram et al. ......... 257/724 |
| 2002/0111007 A1 * | 8/2002 | Kang ............ 438/612 |
| 2004/0026773 A1 * | 2/2004 | Koon et al. ......... 257/692 |
| 2004/0227238 A1 | 11/2004 | Hashimoto |
| 2005/0026414 A1 | 2/2005 | Williams |

FOREIGN PATENT DOCUMENTS

| JP | 01196844 A | 8/1989 |
| WO | WO 2004/077546 A2 | 9/2004 |
| WO | WO 2005/013358 A2 | 2/2005 |

* cited by examiner

*Primary Examiner*—George Fourson
(74) *Attorney, Agent, or Firm*—Edell, Shapiro & Finnan, LLC

(57) ABSTRACT

The invention relates to a semiconductor device with conductor tracks between a semiconductor chip and a circuit carrier, and to a method for producing the same. The conductor tracks extend from contact areas on the top side of the semiconductor chip to contact pads on the circuit carrier. The conductor tracks include an electrically conductive polymer in the semiconductor device.

13 Claims, 7 Drawing Sheets

SEMICONDUCTOR DEVICE WITH CONDUCTOR TRACKS BETWEEN SEMICONDUCTOR CHIP AND CIRCUIT CARRIER AND METHOD FOR PRODUCING THE SAME

CROSS REFERENCE TO RELATED APPLICATIONS

This application claims priority under 35 U.S.C. §§119 and/or 365 to Application No. DE 10 2005 037 321.6 filed on Aug. 4, 2005, entitled "Semiconductor Device with Conductor Tracks Between Semiconductor Chip and Circuit Carrier and Method for Producing the Same," the entire contents of which are hereby incorporated by reference.

FIELD OF THE INVENTION

The invention relates to a semiconductor device comprising conductor tracks between a semiconductor chip and a circuit carrier. In addition, the invention relates to a method for producing the semiconductor device comprising conductor tracks.

BACKGROUND

A semiconductor device includes conductor tracks between a semiconductor chip and a circuit carrier. In the prior art, conductor tracks of this type are only routed as far as the edge of the semiconductor chip or extend to a central bonding channel of a semiconductor chip, the free end of conductor tracks of this type merging into contact areas which are then connected to corresponding contact pads on the circuit carrier via connecting elements, such as bonding wires.

In the prior art, the bonding wires bridge the transition from the surface of the semiconductor chip to the contact pads on the circuit carrier.

This bridging disadvantageously requires a complicated bonding technology in order to fix the bonding wires both on the contact areas and on the contact pads. Moreover, these connecting elements have the disadvantage that when the semiconductor chip and parts of the circuit carrier are embedded into a plastic housing composition, drifting of the bonding wires may occur, so that the housed semiconductor device is not functional. A further disadvantage of the bonding technique is that this connection technique requires a serial manufacturing procedure and is therefore costly and time-consuming. Finally, it is disadvantageous that the fixed points between bonding wires made of gold and/or aluminum and the contact pads or the contact areas may be damaged when the semiconductor device is under thermal loading, with the result that a semi-conductor device of this type may fail under extreme temperature loading during operation.

In order to overcome these disadvantages, a manufacturing solution is known in which flip-chip contacts are arranged directly on the semiconductor chips, and are then fixed on corresponding conductor tracks of a circuit carrier. However, even this solution has disadvantages since; with semiconductor chips becoming larger, a high shear stress loading occurs on the fixed points between flip-chip contacts and contact pads of the circuit carrier, with the result that the fixed points between flip-chip contact and contact pads with conductor tracks on the circuit carrier may be damaged here as well.

SUMMARY

The invention provides a semiconductor device with conductor tracks between a semiconductor chip and a circuit carrier in which neither bonding wires nor flip-chip contacts are required to enable a reliable connection between the semiconductor chip and the circuit carrier.

The invention further provides a semiconductor device with semiconductor tracks between a semiconductor chip and a circuit carrier, the conductor tracks extending from contact areas on the top side of the semiconductor chip to contact pads on the circuit carrier and the conductor tracks comprising an electrically conductive polymer.

A semiconductor device of this type has the advantage that conductor tracks made of an electrically conductive polymer can be adapted to the different contours of circuit carrier and semiconductor chip and follow the contours both horizontally and vertically, so that they can be routed both on the top side and on the edge sides of the semiconductor chip and correspondingly on the top side of the circuit carrier.

Since the electrically conductive polymer can be matched to the predetermined contours, the conductor tracks comprising the polymer are supported by the contours of semiconductor chip and circuit carrier. The compliance of electrically conductive polymers of this type means that there is also no risk whatsoever that shear stresses occurring between circuit carrier and semiconductor chip might interrupt the conductor tracks. Rather, the compliance of electrically conductive polymers of this type ensures that stresses of this type are reduced in the polymer and do not have an effect in the form of cracks of the conductor tracks. With conductor tracks of this type, the reliability of the semiconductor components is thus ensured even under high thermal loading.

In a further embodiment of the invention, the conductor tracks comprise a layer with an electrically nonconductive polymer and a layer with an electrically conductive polymer. A multilayer conductor track has the advantage that a supporting and insulation function can be performed by a polymer that is not electrically conductive and the actual connection function is performed by a layer having electrically conductive polymers. In this case, the conductor track layers may be constructed from the same electrically conductive polymer, but the electrically conductive property of the supporting and insulating layer is deactivated by thermal treatment and/or radiation treatment.

That layer of the conductor track which is not electrically conductive may also perform a bridging function besides a supporting function, relatively short distances between circuit carrier and semiconductor device being bridged. On the other hand, the electrically conductive layer may also comprise a metallic, electrically conductive layer instead of an electrically conductive polymer by virtue of a metal layer being deposited on the lower layer. This results in a topmost layer of the conductor tracks which comprises either an electrically conductive polymer and/or a metal, preferably gold, silver, copper, aluminum, and/or alloys thereof.

The conductor tracks preferably comprise polybenzimidazole and/or polyphenyl sulfide and/or polysulfones and/or polysulfone phenyl sulfide as electrically conductive polymer.

A method for producing semiconductor devices with conductor tracks between semiconductor chips and a circuit carrier with a plurality of semiconductor chip positions has the following method steps.

Firstly, a circuit carrier with a plurality of semiconductor device positions and contact pads and also with a chip contact area is produced. Semiconductor chips are subsequently applied to the chip contact areas by their rear sides in the semiconductor device positions. Conductor tracks made of an electrically conductive polymer are then applied selectively, the conductor tracks extending from contact areas on the top side of the semiconductor chip as far as contact pads on the circuit carrier. Finally, the semiconductor chips, the conductor tracks and partly the circuit carrier are embedded into a plastic housing composition. This may be followed by a separation step in which the circuit carrier with a plurality of semiconductor device positions is separated into individual semiconductor devices.

This method has the advantage that electrical connections between contact areas of a semiconductor chip and contact pads of a circuit carrier no longer have to be bonded serially, rather a multiplicity of conductor tracks can be produced simultaneously in parallel manufacturing between the contact areas of the semiconductor chips and contact pads of the circuit carrier. Furthermore, this method gives rise to conductor tracks which have a high compliance, with the result that shear stresses between semiconductor chip and circuit carrier do not affect the reliability of the connections via the conductor tracks according to the invention.

In one preferred exemplary implementation of the method, metal layers are additionally deposited in electroless fashion on the selectively applied conductor tracks made of an electrically conductive polymer. For such an electroless chemical deposition from corresponding metal salt solutions, the advantage is afforded that masking is not required, rather the metal ions separate from the acid radical preferably on the electrically conductive polymer, so that the electrical conductivity of the conductor tracks can be increased further with the aid of the chemical deposition.

In a further exemplary implementation of the method, the electrically conductive polymer is laminated as a film onto the semiconductor chip and the circuit carrier and the film is subsequently patterned by means of laser ablation to form conductor tracks. Although patterning by means of a laser writing beam is again a serial process, this process can proceed largely in a programmed manner and thus be automated. Moreover, it is possible to pattern the polymer film with the aid of a photolithographic mask and either to incinerate or to dissolve out the unprotected regions of the electrically conductive polymer of the film.

In a further preferred exemplary implementation of the method, a solution comprising the electrically conductive polymer is prepared and sprayed onto the semiconductor chip and the circuit carrier, so that the sprayed-on layer can be patterned photolithographically to form conductor tracks after curing. It is furthermore possible to put the electrically conductive polymer into a molten state and to apply it to the semiconductor chip and the circuit carrier, so that conductor tracks can be patterned photolithographically after cooling.

In principle, it is also possible to carry out an electrodeposition of metallic conductor tracks on a base layer made of electrically conductive polymers. For this purpose, the layer made of electrically conductive polymers has a minimal thickness, the regions that are not to be coated by electroplating subsequently being covered with an insulation layer. Finally, metallic conductor tracks can be electrodeposited on the regions that have remained free in an electroplating bath. The insulation layer and the base layer arranged underneath may subsequently be removed preferably by plasma incineration. In this method variant, too, a multiplicity of conductor tracks can be produced simultaneously and in parallel. Other method variants provide for the conductor tracks made of electrically conductive polymers to be applied selectively by means of liquid jet printing, stencil printing or screen printing.

In one preferred variant of the method, the conductor tracks are produced in two layers made from the same electrically conductive polymer by virtue of a lower layer being electrically deactivated after application to form an insulation layer, which then serves as a supporting or bridging layer for an upper layer made of electrically conductive polymers. The active electrically conductive layer made of polymers is subsequently applied and patterned to form conductor tracks. This method has the advantage that the electrical deactivation provides an insulation layer that is effective on all sides for the semiconductor chips and for the circuit carrier with contact pads and contact areas being left free, so that unintentional short circuits are avoided when selectively applying the conductor tracks.

To summarize, it may be remarked that the bonding wires used hitherto become superfluous as a result of the selective application of an electrically conductive polymer. The polymer performs the function of the connecting wires. The elasticity of this connection significantly increases stability toward stress loading. Furthermore, gold or some other metal can be deposited onto the selectively applied electrically conductive polymer electrolytically or chemically as electrical connection in the form of conductor tracks. In this case, the electrical connection paths from the chip to the periphery grow from the metal salts in an electric field. Particularly when there are a high number of I/O connections, such a connection technology in which all the connections are applied on the chip in one production step, in principle, has significant advantages over the conventional bonding wire processes.

Further advantages consist in the facts that:

1. very small structures can be realized on the chip by means of a photo-process or laser patterning;

2. the entire chip surface can be utilized as connection area;

3. the connection regions on the semiconductor chip are not subjected to mechanical loading.

By application by lamination or printing with subsequent selective ablation, preferably by means of a laser process, or by patterning by means of a photo-process of an electrically conductive polymer on the chip that has already been mounted on the circuit carrier, electrical contact areas on the semiconductor chip can be inexpensively connected to the periphery on a circuit carrier. Consequently, these polymer connections or conductor tracks themselves perform the functions of the bonding wires or of the solder contacts in flip-chip systems.

A further possibility of using electrically conductive polymers as connection material consists in depositing metals such as gold or aluminum for the electrical connections chemically or electrolytically on polymers themselves. The connections thus no longer have a loop form of a kind that occurs in the case of wires and, consequently, are significantly less susceptible to stress. Furthermore, these polymers have the advantage that they are readily able to process proceeding both from a solution and from a melt and have a high temperature stability of greater than 250° C., and also have an acceptable specific conductivity.

The following systems can be realized as conductor track variations:

1. When the required electrical conductivity is low, it is possible to use just the doped solderable polymer as an electrical conductor track.

2. When the required electrical conductivity is higher, a metallic system comprising conductor tracks may also be deposited chemically or electrolytically on a thin, electrically conductive polymer film.

3. As an alternative, the conductivity polymer may be doped such that, for specific applications, the doping is deactivated after the deposition of the metallic conductor tracks on the polymer by means of an increased temperature and the polymer thus loses its intrinsic electrical conductivity.

The invention will now be explained in more detail with reference to the accompanying figures. The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
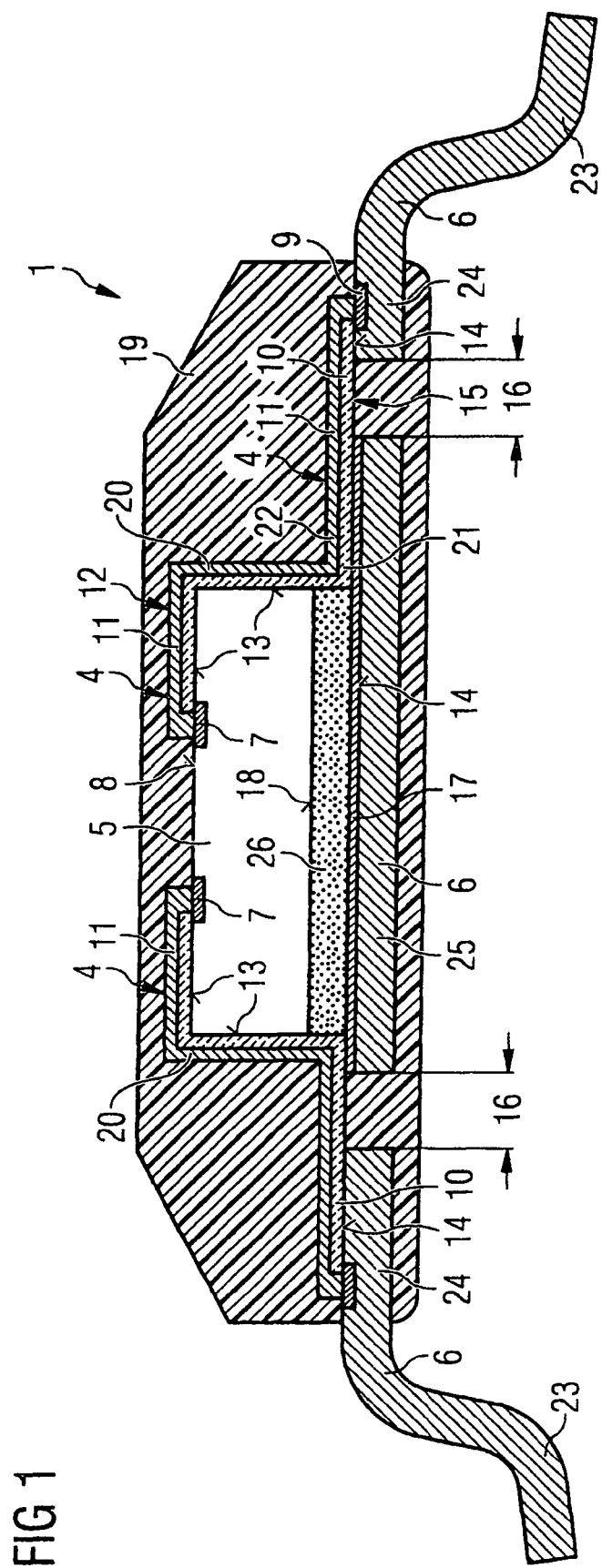
FIG. 1 shows a schematic cross section through a semiconductor device in accordance with a first embodiment of the invention.

FIG. 1 shows a schematic cross section through a semiconductor device 1 in accordance with a first embodiment of the invention. The semiconductor device 1 has a semiconductor chip 5, which is arranged by its rear side on a chip contact area 17 of a circuit carrier 6. In this embodiment of the invention, the circuit carrier comprises a flat conductor lead frame, of which external flat conductors 23, internal flat conductors 24 and a semiconductor chip island 25 with the chip contact area 17 can be seen in the case of this semiconductor device 1. While the semiconductor chip island 25 is directly connected via the chip contact area to the rear side 18 of the semiconductor chip 5 cohesively via a corresponding solder or adhesive layer 26, the internal flat conductors 24 are electrically connected by their contact pads 9 to corresponding contact areas 7 on the top side 8 of the semiconductor chip 5 via multilayer conductor tracks 4.

In this embodiment of the invention, a layer 11 comprising an electrically conductive polymer is supported by an electrically nonconductive layer 10, which simultaneously bridges an uncovered spacing 16 between the internal flat conductor 24 and the semiconductor chip island 25. The electrically nonconductive bridging and supporting layer of the conductor tracks 4 comprises a polymer whose electrically conductive property is deactivated by thermal treatment or by an irradiation treatment, and is arranged as lower layer 21 directly on the contour 14 of the circuit carrier and also on the contour 13 of the semiconductor chip 5 with the contact pads 9 and also the contact areas 7 being left free. The electrical connection between the contact areas 7 on the top side 8 of the semiconductor chip 5 and the contact pads 9 on the top side of the internal flat conductors 24 is undertaken by an upper layer 22, which has the electrically conductive polymer and is not deactivated.

Electrically conductive polymers of this type are preferably selected from the group consisting of polybenzimidazole and/or polyphenyl sulfide and/or poly-sulfones and/or polysulfone phenyl sulfide, since these substances have a high electrical conductivity for polymers. If this electrical conductivity does not suffice for reliably accepting the current loading on the conductor tracks without damage, then a metallic layer preferably comprising gold, silver, copper, aluminum or alloys thereof may be deposited as upper or topmost conductor track layer on the electrically conductive polymers.

The supporting and insulating lower layer 21 can be dispensed with in those cases in which the contour of semiconductor chip and circuit carrier already has an insulating layer made, for example, of silicon oxide or silicon nitride on the semiconductor chip and an oxidic layer or ceramic coating on the circuit carrier with the contact pads and the chip pad being left free.

Besides the effect that conductor tracks of this type enable a stable arrangement of conductor tracks that is mechanically supported by the contour of the semiconductor chip and of the circuit carrier, a further advantage is afforded over bonding wire technology, namely that the inductance of conductor tracks of this type is reduced compared with bonding wire constructions. Consequently, the conductor tracks are more resistant to the affects of interference fields. The internal flat conductors 24, the semiconductor chip island 25 and the semiconductor chip 5 with its conductor tracks 4 are embedded into a plastic housing composition 19, the adhesion of the plastic housing composition to the upper layers 22 of the conductor tracks 4 being particularly intensive and secure if these conductor track layers have, as topmost layer 20, an electrically conductive polymer and no metallic layer.

Figure 2:
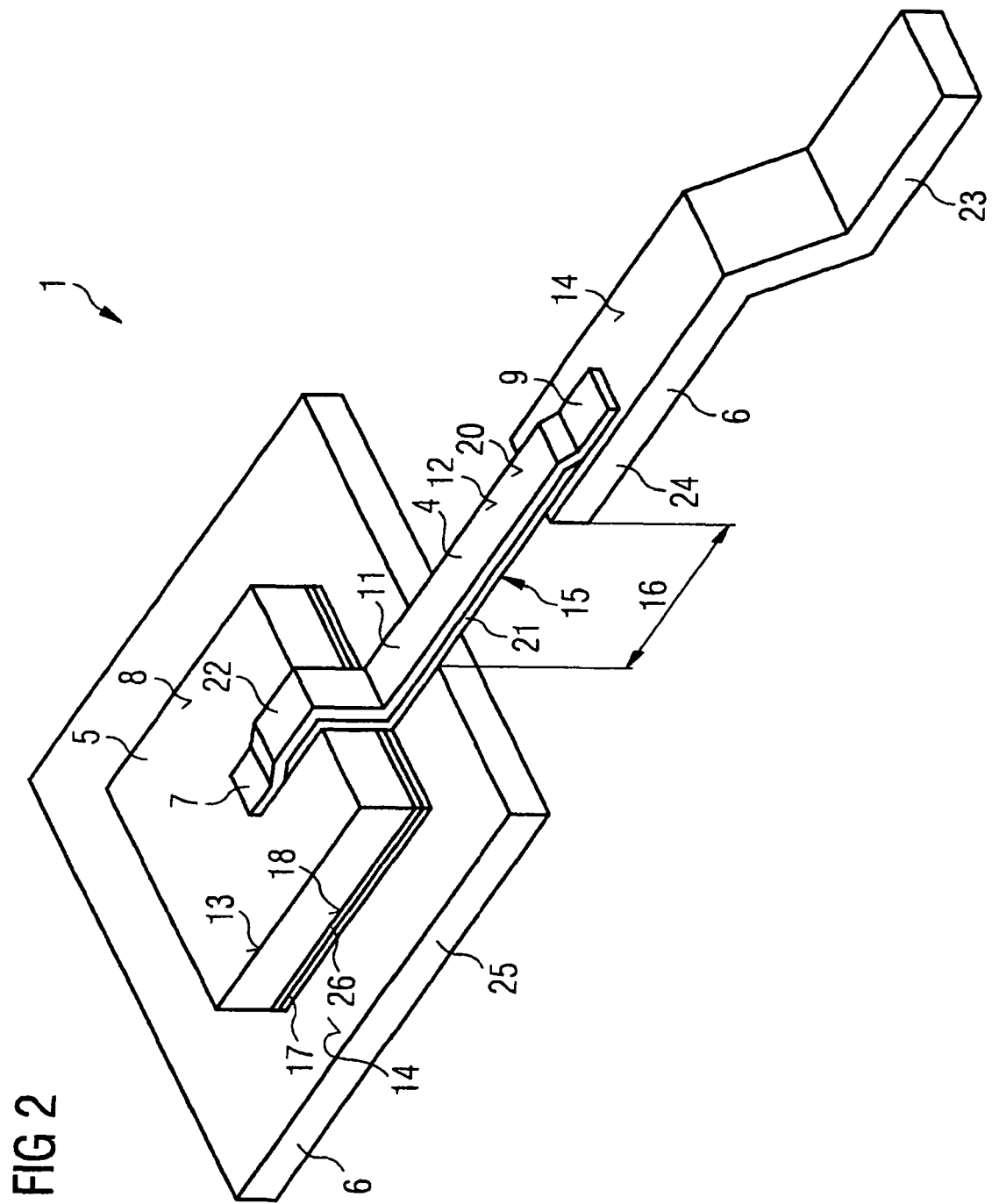
FIG. 2 shows a schematic, perspective view of the semiconductor device in accordance with FIG. 1.

FIG. 2 shows a schematic perspective view of the semiconductor device 1 in accordance with FIG. 1. This schematic view again shows a conductor track 4 comprising a supporting layer 10 made of material that is not electrically conductive, and, arranged thereon, a layer 11 made of electrically conductive polymers. This perspective representation schematically illustrates only one conductor track 4 and shows its perfect adaptation to the contour 13 of the semiconductor chip 5 and also to the contour 14 of the circuit carrier 6, a spacing 16 again having to be bridged by the lower layer 21 as insulating supporting layer.

Figure 3:
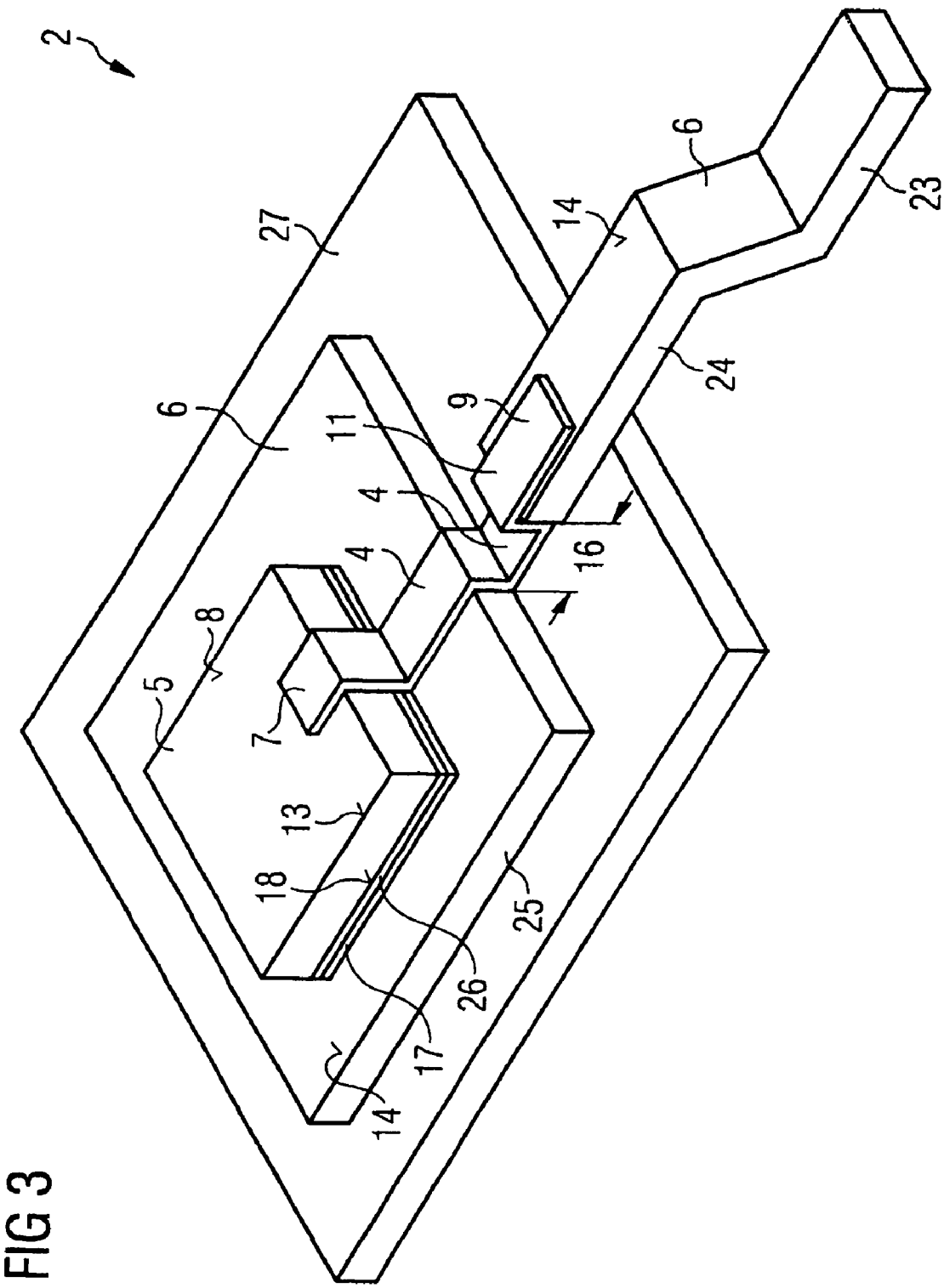
FIG. 3 shows a schematic, perspective view of a semiconductor device in accordance with a second embodiment of the invention.

For purposes of simplification for the reader, only one conductor track 4 is illustrated in the drawing. In practice, a multiplicity of conductor tracks 4, realized by wire bonding in conventional technologies hitherto, extend from the semiconductor chip 5 to the individual internal flat conductors 24. It is to be understood that other embodiments may be utilized and structural or logical changes will be made without departing from the scope of the present invention. The illustrations and the following detailed description, therefore, are not to be taken in a limiting sense, and the scope of the present invention is defined by the appended claims.

FIG. 3 shows a schematic perspective view of a semiconductor device 2 in accordance with a second embodiment of the invention. Components having functions identical to those in the previous figures are identified by identical reference symbols and are not explained separately. The difference between the second embodiment of the invention and the first embodiment of the invention as shown in FIG. I and FIG. 2 is that the conductor track 4 is formed in one layer, which presupposes that the entire contour 13 of the semiconductor chip 5 and the contour 14 of the circuit carrier 6 and also the internal flat conductor 24 associated with the circuit carrier 6 already have insulation layers with contact areas 7 on the top side 8 of the semiconductor chip 5 being left free, and also with contact pads 9 on the top side of the internal flat conductors 24 being left free.

In this case, an insulating lower layer of the kind still shown in FIG. 1 and FIG. 2 can be dispensed with, and at the same time the conductor tracks 4 can be completely adapted to the contour of the semiconductor chips 5 and of the circuit carrier 6. A carrier plate 27 for bridging 15 the spacing 16 may be removed after completion of the conductor tracks 4 or be provided as a heat sink for the semiconductor device. In FIG. 3, too, only a single conductor track is shown for simplification for the reader, but in practice a semiconductor device 2 of this type has a multiplicity of conductor tracks 4 which connect the contact areas 7 of the semiconductor chip 5 to contact pads 9 on the internal flat conductors 24.

It is to be understood that other embodiments may be utilized and structural or logical changes will be made without departing from the scope of the present invention. The illustrations and the following detailed description, therefore, are not to be taken in a limiting sense, and the scope of the present invention is defined by the appended claims.

Figure 4:
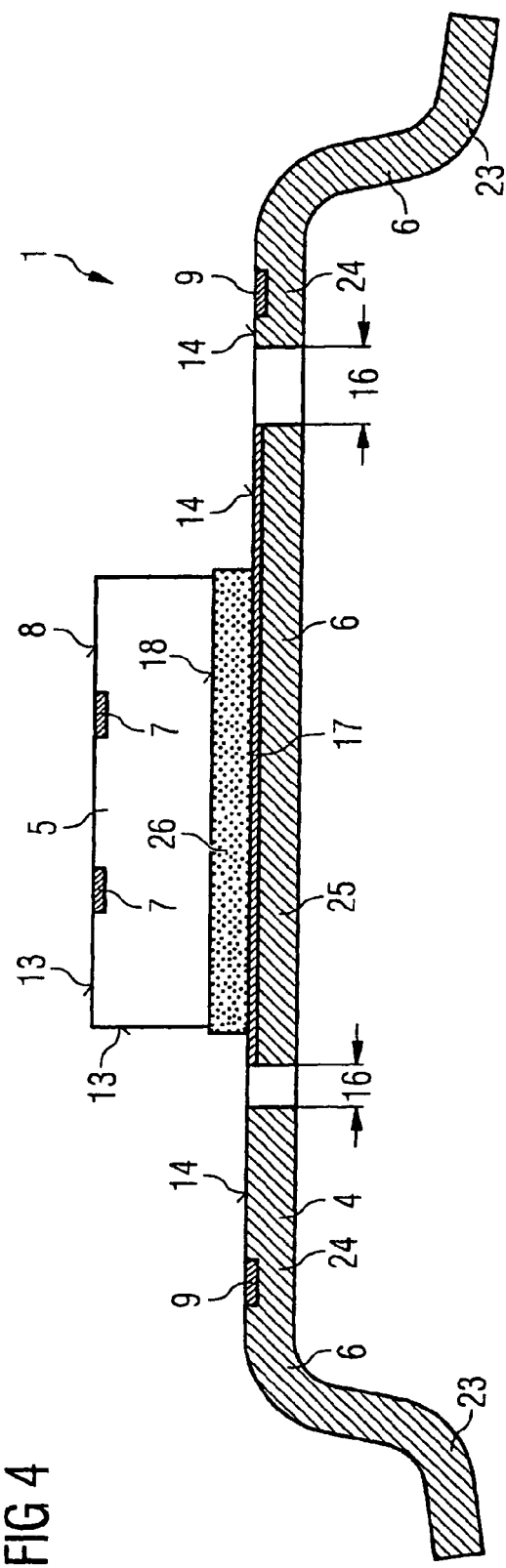
FIG. 4 shows a schematic cross section through a circuit carrier after the application of a semiconductor chip to a chip contact area.
Figure 5:
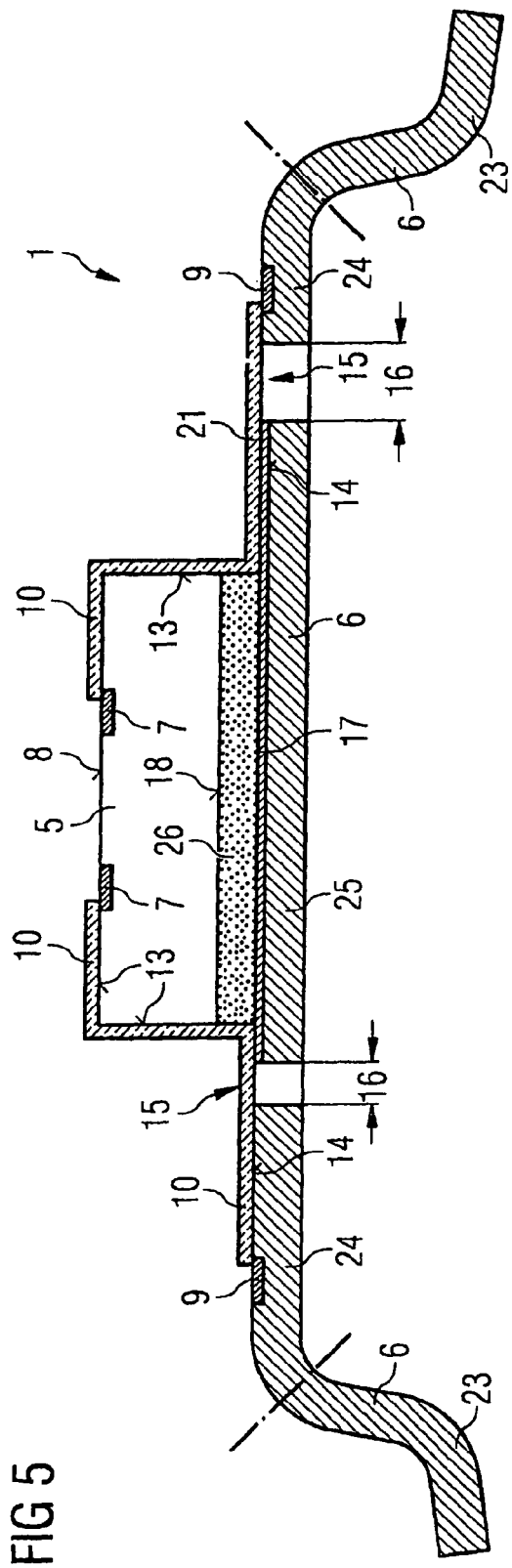
FIG. 5 shows a schematic cross section through the circuit carrier from FIG. 4 after the application of an electrically insulating polymer.
Figure 6:
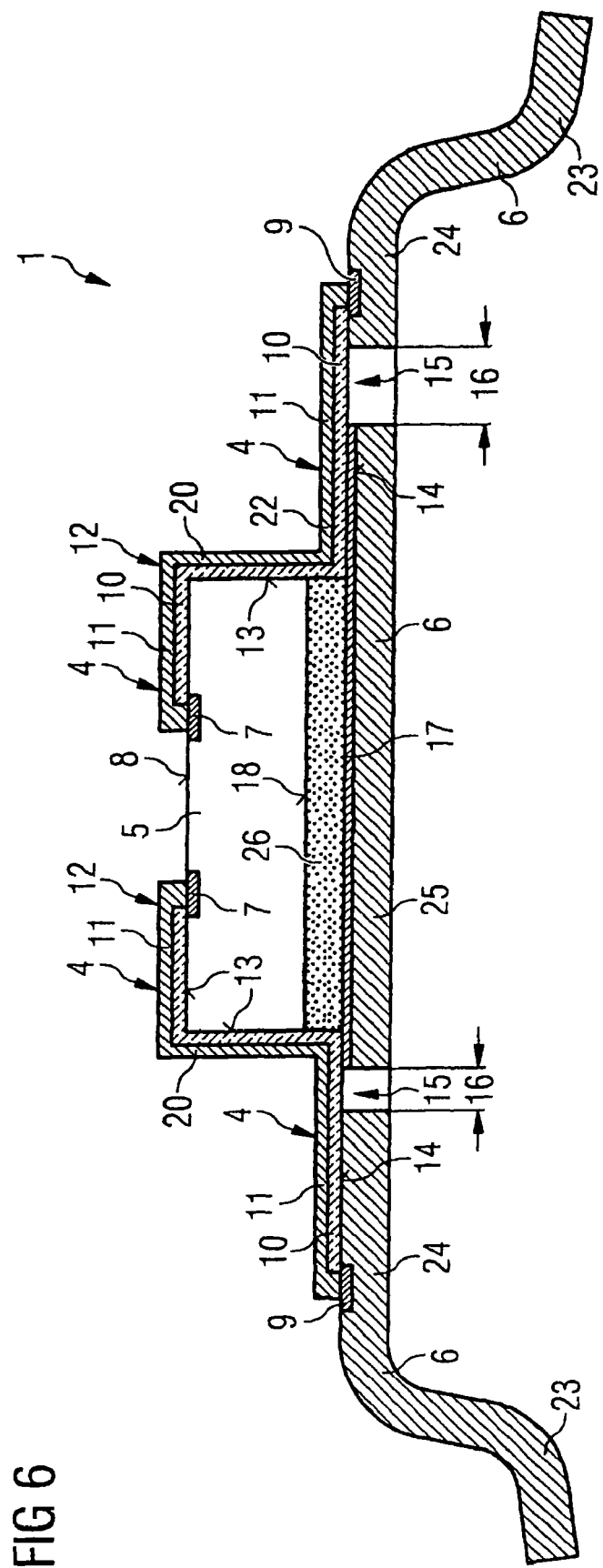
FIG. 6 shows a schematic cross section through the circuit carrier from FIG. 4 after the application of conductor tracks of an electrically conductive polymer.

FIGS. 4 to 6 show schematic cross sections through components during the production of a semiconductor device 1 with conductor tracks 4 having electrically conductive polymers.

FIG. 4 shows a schematic cross section through a circuit carrier 6 after the application of a semiconductor chip 5 to a chip contact area 17. The cohesive connection between the chip contact area 17 and the rear side 18 of the semiconductor chip 5 is achieved via a solder or adhesive layer 26. On its top side 8, the semiconductor chip 5 has contact areas 7 which are to be connected to corresponding contact pads 9 on the circuit carrier 6 via corresponding connection elements.

FIG. 5 shows a schematic cross section through the circuit carrier 6 from FIG. 4 after the application of an electrically insulating polymer. The electrically insulating polymer is laminated as a lower layer 21 onto the circuit carrier 6 and onto the semiconductor chip 5. Bridgings 15 of the uncovered spacings 16 between the semiconductor chip island 25 carrying the semiconductor chip 5 and the internal flat conductors 24 arise in the process. The contact pads 9 on the internal flat conductors 24 and the contact areas 7 on the top side 8 of the semiconductor chip 5 remain free of the coating. The material of this electrically nonconductive layer 10 may indeed be an electrically conductive polymer which is subsequently deactivated by thermal treatment or irradiation treatment. It is also possible to use a corresponding nonconductive polymer for the insulation, supporting and bridging layer 10.

FIG. 6 shows a schematic cross section through the circuit carrier 6 in accordance with FIG. 4 after the application of conductor tracks 4 having an electrically conductive polymer. In this embodiment of the invention, the lower layer 21 was not patterned, rather only the upper layer 22 was patterned into individual conductor tracks 4. Instead of a correspondingly thick electrically conductive layer 11 made of electrically conductive polymers, it is also possible firstly to deposit a thin patterned conductor track layer 4 made of electrically conductive polymers and this electrically conductive polymer layer can subsequently be reinforced by chemical deposition of metals to form a metal layer 20 from a salt melt to form low-impedance conductor tracks 4. Moreover, it is also possible to deposit a topmost layer 12 via electrodeposition as a low-impedance conductor track 4 on a base layer made of electrically conductive polymers.

Figure 7:
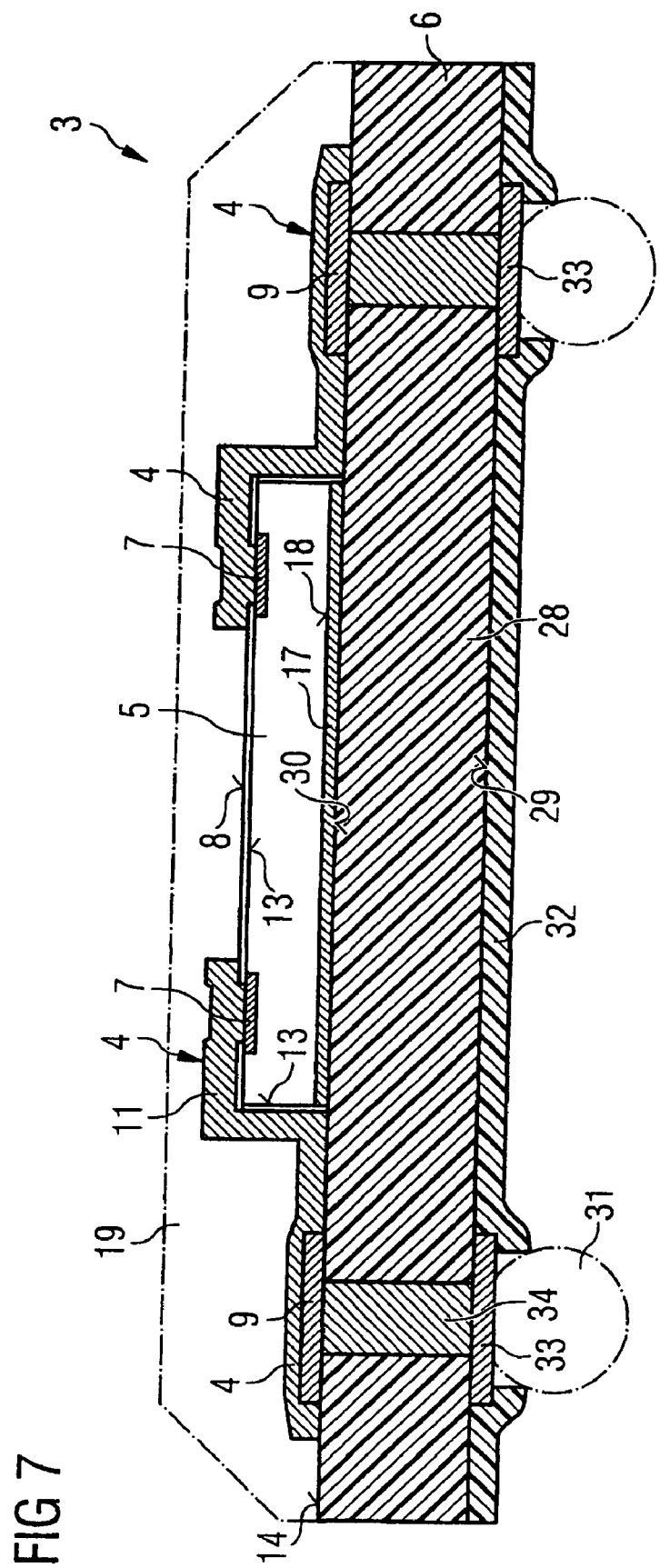
FIG. 7 shows a schematic cross section through a semiconductor device of a third embodiment of the invention.

FIG. 7 shows a schematic cross section through a semiconductor device 3 of a third embodiment of the invention. Components having functions identical to those in the previous figures are identified by identical reference symbols and are not explained separately.

This third embodiment of the invention differs from the previous embodiments by the fact that instead of a flat conductor leadframe, a wiring substrate 28 is used as circuit carrier 6. In this embodiment of the invention, the wiring substrate 28 has an underside 29 and a top side 30. Arranged on the top side 30 is the chip contact area 17, on which the semiconductor chip 5 is fixed, and the contact pads 9 are arranged all round the semiconductor chip 5. The contact pads 9 are electrically connected via through contacts 34 to external contact areas 33 on the underside 29 of the semiconductor chip 5. The external contact areas 33 are provided for external contacts 31 which are shown here as solder balls by means of dash-dotted lines.

A soldering resist layer 32 on the underside 29 of the wiring substrate 28 as circuit carrier 6 prevents the solder material of the external contacts 31 from propagating on the underside 29 of the circuit carrier 6 during surface mounting on a superordinate circuit board. The conductor tracks 4 according to the invention, having an electrically conductive polymer, are adapted to the contour 13 of the semiconductor chip and to the contour 14 of the circuit carrier 6 in such a way that they extend from the contact areas 7 on the top side 8 of the semiconductor chip 5 as far as the contact pads 9 on the wiring substrate 28. The top side 30 of the wiring substrate 28 is covered with a plastic housing composition 19 embedding the conductor tracks 4 and the semiconductor chip 5.

Figure 8:
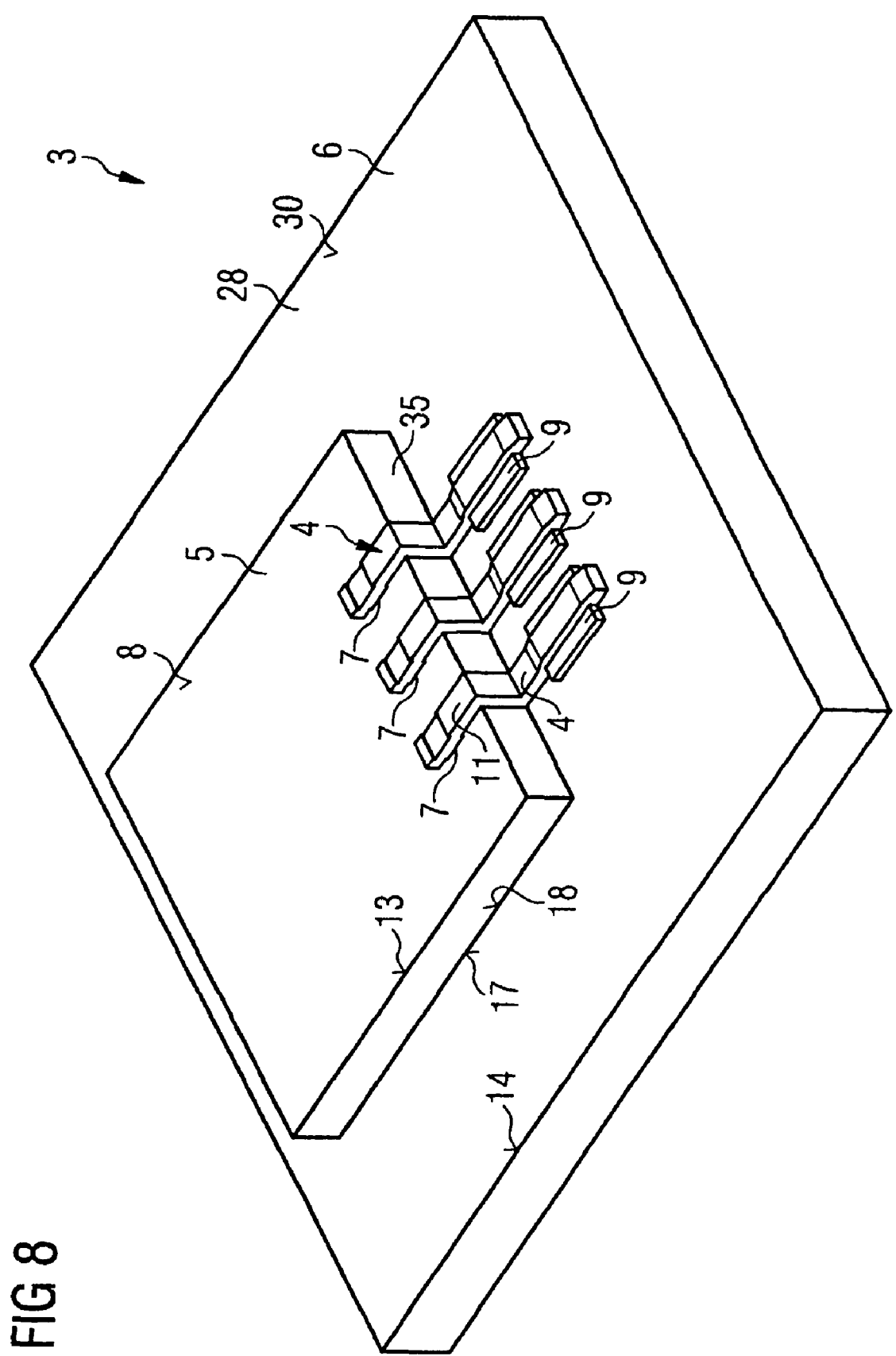
FIG. 8 shows a schematic, perspective view of the semiconductor device in accordance with FIG. 7.

FIG. 8 shows a schematic perspective view of the semiconductor device 3 in accordance with FIG. 7 without the plastic housing composition indicated by a dash-dotted line in FIG. 7. Moreover, FIG. 8 only schematically shows three of a multiplicity of conductor tracks 4 that extend and conform to the contours of the top side 8 of the semiconductor chip 5 via the edge sides 35 to the top side 30 of the circuit carrier 6. Since, these conductor tracks 4 comprise electrically conductive polymers, the contact areas 7 on the top side 8 of the semiconductor chip 5 are electrically connected to the contact pads 9 on the top side 30 of the wiring substrate 28.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS

1. Semiconductor device (1st embodiment)
2. Semiconductor device (2nd embodiment)
3. Semiconductor device (3rd embodiment)

4. Conductor track
5. Semiconductor chip
6. Circuit carrier
7. Contact area
8. Top side of the semiconductor chip
9. Contact pad
10. Electrically nonconductive layer, supporting layer, bridging layer
11. Electrically conductive layer
12. Topmost layer
13. Contour of the semiconductor chip
14. Contour of the circuit carrier
15. Bridging
16. Uncovered spacing
17. Chip contact area
18. Rear side of the semiconductor chip
19. Plastic housing composition
20. Metal layer
21. Lower layer
22. Upper layer
23. External flat conductor
24. Internal flat conductor
25. Semiconductor chip island
26. Solder or adhesive layer
27. Carrier plate
28. Wiring substrate
29. Underside of the wiring substrate
30. Top side of the wiring substrate
31. External contacts comprising solder balls
32. Soldering resist layer
33. External contact area
34. Through contact
35. Edge side of the semiconductor chip

What is claimed is
1. A semiconductor device comprising:
a semiconductor chip including contact areas on a top side of the semiconductor chip;
a circuit carrier including contact pads; and
conductor tracks extending from the contact areas of the semiconductor chip to the contact pads of the circuit carrier, wherein the conductor tracks comprise an electrically conductive polymer including at least one of: polybenzimidazole, polyphenyl sulfide, polysulfones, and polysulfone phenyl sulfide.
2. The semiconductor device of claim 1, wherein the conductor tracks comprise a layer that includes an electrically nonconductive polymer and a layer that includes an electrically conductive polymer.
3. The semiconductor device of claim 2, wherein the nonconductive layer of the conductor tracks comprises at least one of a supporting layer and a bridging layer.
4. The semiconductor device of claim 1, wherein the conductor tracks further comprise a metallic, electrically conductive layer.
5. The semiconductor device of claim 1, wherein the conductor tracks include a topmost layer that comprises at least one of an electrically conductive polymer and a metal selected from the group consisting of Au, Ag, Cu, Al and alloys thereof.
6. The semiconductor device of claim 1, wherein the conductor tracks extend on contours of the semiconductor chip and of the circuit carrier, and the conductor tracks further comprise self-supporting bridgings comprising a polymer material that spans over uncovered spacings of the circuit carrier.

7. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier;
embedding the semiconductor chip, the conductor tracks and at least part of the circuit carrier into a plastic housing composition; and
electrolessly depositing a metal layer on the conductor tracks.
8. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier, wherein selectively providing the conductor tracks comprises: laminating the electrically conductive polymer as a film onto the semiconductor chip and onto the circuit carrier; and forming the conductor tracks by patterning the circuit carrier via laser ablation; and
embedding the semiconductor chip, the conductor tracks and at least part of the circuit carrier into a plastic housing composition.
9. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier, wherein selectively providing the conductor tracks comprises: spraying a solution comprising the electrically conductive polymer onto the semiconductor chip and the circuit carrier; curing the electrically conductive polymer solution; and forming the conductor tracks via photolithographically patterning of the electrically conductive polymer; and embedding the semiconductor chip, the conductor tracks and at least part of the circuit carrier into a plastic housing composition.

10. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier, wherein providing the conductor tracks comprises: applying a melt of the electrically conductive polymer to the semiconductor chip and the circuit carrier; cooling the electrically conductive polymer melt; and forming the conductor tracks via photolithographically patterning of the electrically conductive polymer; and
embedding the semiconductor chip, the conductor tracks and at least part of the circuit carrier into a plastic housing composition.

11. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier, wherein providing the conductor tracks comprises: applying a base layer, made of electrically conductive polymers with a minimal selected thickness, to the semiconductor chip and the circuit carrier; covering selected regions of the base layer, which are not to be coated by electroplating, with an insulation layer; forming conductor tracks via electrodeposition in the uncovered regions of the base layer; and removing the insulation layer and the base layer; and
embedding the semiconductor chip, the conductor tracks and at least part of the circuit carrier into a plastic housing composition.

12. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier, wherein providing the conductor tracks comprises one of liquid jet printing, stencil printing and screen printing; and
embedding the semiconductor chip, the conductor tracks and at least part of the circuit carrier into a plastic housing composition.

13. A method for producing semiconductor devices with conductor tracks between semiconductor chips and a circuit carrier with a plurality of semiconductor device positions, the method comprising:
producing a circuit carrier that includes a plurality of semiconductor device positions, contact pads and chip contact areas;
applying a rear side of at least one semiconductor chip to at least one chip contact area in one of the semiconductor device positions, the semiconductor chip including contact areas on a top side of the semiconductor chip;
selectively providing conductor tracks, the conductor tracks comprising an electrically conductive polymer, such that the conductor tracks extend from the contact areas on the top side of the semiconductor chip to the contact pads on the circuit carrier, wherein providing the conductor tracks comprises: applying a lower layer; electrically deactivating the lower layer so as to form an insulation layer that serves as a supporting or bridging layer for an upper layer; applying the upper layer made of electrically conductive polymers to the insulation layer; and patterning the upper layer to form the conductor tracks; and
embedding the semiconductor chip, the conductor tracks and at least part of the circuit carrier into a plastic housing composition.

* * * * *